US009455327B2

(12) United States Patent
Ritenour

(10) Patent No.: US 9,455,327 B2
(45) Date of Patent: Sep. 27, 2016

(54) SCHOTTKY GATED TRANSISTOR WITH INTERFACIAL LAYER

(71) Applicant: RF Micro Devices, Inc., Greensboro, NC (US)

(72) Inventor: Andrew P. Ritenour, Colfax, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/731,736

(22) Filed: Jun. 5, 2015

(65) Prior Publication Data

US 2015/0357457 A1 Dec. 10, 2015

Related U.S. Application Data

(60) Provisional application No. 62/008,900, filed on Jun. 6, 2014.

(51) Int. Cl.
*H01L 29/66* (2006.01)
*H01L 29/51* (2006.01)
(Continued)

(52) U.S. Cl.
CPC ....... *H01L 29/517* (2013.01); *H01L 21/28264* (2013.01); *H01L 29/1054* (2013.01);
(Continued)

(58) Field of Classification Search
CPC ........... H01L 29/7787; H01L 29/2003; H01L 29/475; H01L 29/495
USPC ........................................................ 257/194
See application file for complete search history.

(56) References Cited

U.S. PATENT DOCUMENTS 4,317,055 A 2/1982 Yoshida et al.
4,540,954 A 9/1985 Apel
(Continued)

FOREIGN PATENT DOCUMENTS

EP 1826041 A1 8/2007
EP 1187229 A1 3/2013
(Continued)

OTHER PUBLICATIONS

Lin, C.K. et al., "GaN Lattice Matched ZnO/$Pr_2O_3$ Film as Gate Dielectric Oxide Layer for AlGaN/GaN HEMT," IEEE International Conference of Electron Devices and Solid-State Circuits, EDSSC 2009, IEEE, Dec. 25-27, 2009, Xi'an, China, pp. 408-411.
(Continued)

*Primary Examiner* — Tan N Tran
(74) *Attorney, Agent, or Firm* — Withrow & Terranova, P.L.L.C.

(57) ABSTRACT

A Schottky gated transistor having reduced gate leakage current is disclosed. The Schottky gated transistor includes a substrate and a plurality of epitaxial layers disposed on the substrate. Further included is a gate contact having an interfacial layer disposed on a surface of the plurality of epitaxial layers and having a thickness that is between about 5 Angstroms (Å) and 40 Å. The interfacial layer can be made up of non-native materials in contrast to a native insulator such as silicon dioxide ($SiO_2$) that is used as an insulating gate layer with silicon-based power transistors. The Schottky gated transistor further includes at least one metal layer disposed over the interfacial layer. A source contact and a drain contact are disposed on the surface of the plurality of epitaxial layers, wherein the source contact and the drain contact are spaced apart from the gate contact and each other.

19 Claims, 3 Drawing Sheets

(51) Int. Cl.
  *H01L 21/28* (2006.01)
  *H01L 29/423* (2006.01)
  *H01L 29/78* (2006.01)
  *H01L 29/10* (2006.01)
  *H01L 29/20* (2006.01)
  *H01L 29/47* (2006.01)
  *H01L 29/778* (2006.01)
  *H01L 29/812* (2006.01)
  *H01L 29/49* (2006.01)

(52) U.S. Cl.
  CPC ......... *H01L29/42364* (2013.01); *H01L 29/78* (2013.01); *H01L 29/2003* (2013.01); *H01L 29/475* (2013.01); *H01L 29/4958* (2013.01); *H01L 29/518* (2013.01); *H01L 29/778* (2013.01); *H01L 29/812* (2013.01)

(56) References Cited

U.S. PATENT DOCUMENTS

| | | |
|---|---|---|
| 4,543,535 A | 9/1985 | Ayasli |
| 4,620,207 A | 10/1986 | Calviello |
| 4,788,511 A | 11/1988 | Schindler |
| 5,028,879 A | 7/1991 | Kim |
| 5,046,155 A | 9/1991 | Beyer et al. |
| 5,047,355 A | 9/1991 | Huber et al. |
| 5,107,323 A | 4/1992 | Knolle et al. |
| 5,118,993 A | 6/1992 | Yang |
| 5,208,547 A | 5/1993 | Schindler |
| 5,227,734 A | 7/1993 | Schindler et al. |
| 5,306,656 A | 4/1994 | Williams et al. |
| 5,361,038 A | 11/1994 | Allen et al. |
| 5,365,197 A | 11/1994 | Ikalainen |
| 5,389,571 A | 2/1995 | Takeuchi et al. |
| 5,414,387 A | 5/1995 | Nakahara et al. |
| 5,485,118 A | 1/1996 | Chick |
| 5,608,353 A | 3/1997 | Pratt |
| 5,629,648 A | 5/1997 | Pratt |
| 5,698,870 A | 12/1997 | Nakano et al. |
| 5,742,205 A | 4/1998 | Cowen et al. |
| 5,764,673 A | 6/1998 | Kawazu et al. |
| 5,834,326 A | 11/1998 | Miyachi et al. |
| 5,843,590 A | 12/1998 | Miura et al. |
| 5,864,156 A | 1/1999 | Juengling |
| 5,874,747 A | 2/1999 | Redwing et al. |
| 5,880,640 A | 3/1999 | Dueme |
| 5,914,501 A | 6/1999 | Antle et al. |
| 5,949,140 A | 9/1999 | Nishi et al. |
| 6,049,250 A | 4/2000 | Kintis et al. |
| 6,064,082 A | 5/2000 | Kawai et al. |
| 6,110,757 A | 8/2000 | Udagawa |
| 6,130,579 A | 10/2000 | Iyer et al. |
| 6,133,589 A | 10/2000 | Krames et al. |
| 6,177,685 B1 | 1/2001 | Teraguchi et al. |
| 6,191,656 B1 | 2/2001 | Nadler |
| 6,229,395 B1 | 5/2001 | Kay |
| 6,265,943 B1 | 7/2001 | Dening et al. |
| 6,271,727 B1 | 8/2001 | Schmukler |
| 6,285,239 B1 | 9/2001 | Iyer et al. |
| 6,306,709 B1 | 10/2001 | Miyagi et al. |
| 6,307,364 B1 | 10/2001 | Augustine |
| 6,313,705 B1 | 11/2001 | Dening et al. |
| 6,329,809 B1 | 12/2001 | Dening et al. |
| 6,333,677 B1 | 12/2001 | Dening |
| 6,342,815 B1 | 1/2002 | Kobayashi |
| 6,356,150 B1 | 3/2002 | Spears et al. |
| 6,369,656 B2 | 4/2002 | Dening et al. |
| 6,369,657 B2 | 4/2002 | Dening et al. |
| 6,373,318 B1 | 4/2002 | Dohnke et al. |
| 6,376,864 B1 | 4/2002 | Wang |
| 6,377,125 B1 | 4/2002 | Pavio et al. |
| 6,384,433 B1 | 5/2002 | Barratt et al. |
| 6,387,733 B1 | 5/2002 | Holyoak et al. |
| 6,392,487 B1 | 5/2002 | Alexanian |
| 6,400,226 B2 | 6/2002 | Sato |
| 6,404,287 B2 | 6/2002 | Dening et al. |
| 6,418,174 B1 | 7/2002 | Benedict |
| 6,448,793 B1 | 9/2002 | Barratt et al. |
| 6,455,877 B1 | 9/2002 | Ogawa et al. |
| 6,475,916 B1 | 11/2002 | Lee et al. |
| 6,477,682 B2 | 11/2002 | Cypher |
| 6,521,998 B1 | 2/2003 | Teraguchi et al. |
| 6,525,611 B1 | 2/2003 | Dening et al. |
| 6,528,983 B1 | 3/2003 | Augustine |
| 6,560,452 B1 | 5/2003 | Shealy |
| 6,566,963 B1 | 5/2003 | Yan et al. |
| 6,589,877 B1 | 7/2003 | Thakur |
| 6,593,597 B2 | 7/2003 | Sheu |
| 6,608,367 B1 | 8/2003 | Gibson et al. |
| 6,614,281 B1 | 9/2003 | Baudelot et al. |
| 6,621,140 B1 | 9/2003 | Gibson et al. |
| 6,624,452 B2 | 9/2003 | Yu et al. |
| 6,627,552 B1 | 9/2003 | Nishio et al. |
| 6,633,073 B2 | 10/2003 | Rezvani et al. |
| 6,633,195 B2 | 10/2003 | Baudelot et al. |
| 6,639,470 B1 | 10/2003 | Andrys et al. |
| 6,656,271 B2 | 12/2003 | Yonehara et al. |
| 6,657,592 B2 | 12/2003 | Dening et al. |
| 6,660,606 B2 | 12/2003 | Miyabayashi et al. |
| 6,701,134 B1 | 3/2004 | Epperson |
| 6,701,138 B2 | 3/2004 | Epperson et al. |
| 6,706,576 B1 | 3/2004 | Ngo et al. |
| 6,720,831 B2 | 4/2004 | Dening et al. |
| 6,723,587 B2 | 4/2004 | Cho et al. |
| 6,724,252 B2 | 4/2004 | Ngo et al. |
| 6,727,762 B1 | 4/2004 | Kobayashi |
| 6,748,204 B1 | 6/2004 | Razavi et al. |
| 6,750,158 B2 | 6/2004 | Ogawa et al. |
| 6,750,482 B2 | 6/2004 | Seaford et al. |
| 6,759,907 B2 | 7/2004 | Orr et al. |
| 6,802,902 B2 | 10/2004 | Beaumont et al. |
| 6,815,722 B2 | 11/2004 | Lai et al. |
| 6,815,730 B2 | 11/2004 | Yamada |
| 6,822,842 B2 | 11/2004 | Friedrichs et al. |
| 6,861,677 B2 | 3/2005 | Chen |
| 6,943,631 B2 | 9/2005 | Scherrer et al. |
| 7,015,512 B2 | 3/2006 | Park et al. |
| 7,026,665 B1 | 4/2006 | Smart et al. |
| 7,033,961 B1 | 4/2006 | Smart et al. |
| 7,042,150 B2 | 5/2006 | Yasuda |
| 7,052,942 B1 | 5/2006 | Smart et al. |
| 7,211,822 B2 | 5/2007 | Nagahama et al. |
| 7,408,182 B1 | 8/2008 | Smart et al. |
| 7,449,762 B1 | 11/2008 | Singh |
| 7,459,356 B1 | 12/2008 | Smart et al. |
| 7,557,421 B1 | 7/2009 | Shealy et al. |
| 7,719,055 B1 | 5/2010 | McNutt et al. |
| 7,768,758 B2 | 8/2010 | Maier et al. |
| 7,804,262 B2 | 9/2010 | Schuster et al. |
| 7,935,983 B2 | 5/2011 | Saito et al. |
| 7,968,391 B1 | 6/2011 | Smart et al. |
| 7,974,322 B2 | 7/2011 | Ueda et al. |
| 8,017,981 B2 | 9/2011 | Sankin et al. |
| 8,237,198 B2 | 8/2012 | Wu et al. |
| 8,405,068 B2 | 3/2013 | O'Keefe |
| 8,502,258 B2 | 8/2013 | O'Keefe |
| 8,530,978 B1 | 9/2013 | Chu et al. |
| 8,633,518 B2 | 1/2014 | Suh et al. |
| 8,692,294 B2 | 4/2014 | Chu et al. |
| 8,785,976 B2 | 7/2014 | Nakajima et al. |
| 8,988,097 B2 | 3/2015 | Ritenour |
| 9,070,761 B2 | 6/2015 | Johnson |
| 9,082,836 B2 | 7/2015 | Senda |
| 9,093,420 B2 | 7/2015 | Kobayashi et al. |
| 9,124,221 B2 | 9/2015 | Vetury et al. |
| 9,129,802 B2 | 9/2015 | Ritenour |
| 9,136,341 B2 | 9/2015 | Kobayashi et al. |
| 2001/0040246 A1 | 11/2001 | Ishii |
| 2001/0054848 A1 | 12/2001 | Baudelot et al. |
| 2002/0005528 A1 | 1/2002 | Nagahara |
| 2002/0031851 A1 | 3/2002 | Linthicum et al. |
| 2002/0048302 A1 | 4/2002 | Kimura |
| 2002/0079508 A1 | 6/2002 | Yoshida |

(56) References Cited

U.S. PATENT DOCUMENTS

| | | |
|---|---|---|
| 2003/0003630 A1 | 1/2003 | Iimura et al. |
| 2003/0122139 A1 | 7/2003 | Meng et al. |
| 2003/0160307 A1 | 8/2003 | Gibson et al. |
| 2003/0160317 A1 | 8/2003 | Sakamoto et al. |
| 2003/0206440 A1 | 11/2003 | Wong |
| 2003/0209730 A1 | 11/2003 | Gibson et al. |
| 2003/0218183 A1 | 11/2003 | Micovic et al. |
| 2004/0070003 A1 | 4/2004 | Gaska et al. |
| 2004/0130037 A1 | 7/2004 | Mishra et al. |
| 2004/0144991 A1 | 7/2004 | Kikkawa |
| 2004/0227211 A1 | 11/2004 | Saito et al. |
| 2004/0241916 A1 | 12/2004 | Chau et al. |
| 2005/0110042 A1 | 5/2005 | Saito et al. |
| 2005/0139868 A1 | 6/2005 | Anda |
| 2005/0189559 A1 | 9/2005 | Saito et al. |
| 2005/0189562 A1 | 9/2005 | Kinzer et al. |
| 2005/0194612 A1 | 9/2005 | Beach |
| 2005/0212049 A1 | 9/2005 | Onodera |
| 2005/0225912 A1 | 10/2005 | Pant et al. |
| 2005/0271107 A1 | 12/2005 | Murakami et al. |
| 2005/0274977 A1 | 12/2005 | Saito et al. |
| 2006/0043385 A1 | 3/2006 | Wang et al. |
| 2006/0043501 A1 | 3/2006 | Saito et al. |
| 2006/0054924 A1 | 3/2006 | Saito et al. |
| 2006/0068601 A1 | 3/2006 | Lee et al. |
| 2006/0124960 A1 | 6/2006 | Hirose et al. |
| 2006/0205161 A1 | 9/2006 | Das et al. |
| 2006/0243988 A1 | 11/2006 | Narukawa et al. |
| 2006/0246680 A1* | 11/2006 | Bhattacharyya ........ H01L 21/84 438/400 |
| 2006/0249750 A1 | 11/2006 | Johnson et al. |
| 2006/0255377 A1 | 11/2006 | Tu |
| 2007/0026676 A1 | 2/2007 | Li et al. |
| 2007/0093009 A1 | 4/2007 | Baptist et al. |
| 2007/0158692 A1 | 7/2007 | Nakayama et al. |
| 2007/0164326 A1 | 7/2007 | Okamoto et al. |
| 2007/0205433 A1 | 9/2007 | Parikh et al. |
| 2007/0295985 A1 | 12/2007 | Weeks, Jr. et al. |
| 2008/0023706 A1 | 1/2008 | Saito et al. |
| 2008/0073752 A1 | 3/2008 | Asai et al. |
| 2008/0112448 A1 | 5/2008 | Ueda et al. |
| 2008/0121875 A1 | 5/2008 | Kim |
| 2008/0142837 A1 | 6/2008 | Sato et al. |
| 2008/0179737 A1 | 7/2008 | Haga et al. |
| 2008/0190355 A1 | 8/2008 | Chen et al. |
| 2008/0272382 A1 | 11/2008 | Kim et al. |
| 2008/0272422 A1 | 11/2008 | Min |
| 2008/0283821 A1 | 11/2008 | Park et al. |
| 2008/0308813 A1 | 12/2008 | Suh et al. |
| 2009/0072269 A1 | 3/2009 | Suh et al. |
| 2009/0090984 A1 | 4/2009 | Khan et al. |
| 2009/0146185 A1 | 6/2009 | Suh et al. |
| 2009/0146186 A1 | 6/2009 | Kub et al. |
| 2009/0166677 A1 | 7/2009 | Shibata et al. |
| 2009/0200576 A1 | 8/2009 | Saito et al. |
| 2009/0273002 A1 | 11/2009 | Chiou et al. |
| 2009/0278137 A1 | 11/2009 | Sheridan et al. |
| 2010/0025657 A1 | 2/2010 | Nagahama et al. |
| 2010/0025737 A1 | 2/2010 | Ishikura |
| 2010/0133567 A1 | 6/2010 | Son |
| 2010/0187575 A1 | 7/2010 | Baumgartner et al. |
| 2010/0207164 A1 | 8/2010 | Shibata et al. |
| 2010/0230656 A1 | 9/2010 | O'Keefe |
| 2010/0230717 A1 | 9/2010 | Saito |
| 2010/0258898 A1 | 10/2010 | Lahreche |
| 2011/0017972 A1 | 1/2011 | O'Keefe |
| 2011/0025422 A1 | 2/2011 | Marra et al. |
| 2011/0031633 A1 | 2/2011 | Hsu et al. |
| 2011/0095337 A1 | 4/2011 | Sato |
| 2011/0101300 A1 | 5/2011 | O'Keefe |
| 2011/0108887 A1 | 5/2011 | Fareed et al. |
| 2011/0115025 A1 | 5/2011 | Okamoto |
| 2011/0127586 A1 | 6/2011 | Bobde et al. |
| 2011/0163342 A1 | 7/2011 | Kim et al. |
| 2011/0175142 A1 | 7/2011 | Tsurumi et al. |
| 2011/0199148 A1 | 8/2011 | Iwamura |
| 2011/0211289 A1 | 9/2011 | Kosowsky et al. |
| 2011/0242921 A1 | 10/2011 | Tran et al. |
| 2011/0290174 A1 | 12/2011 | Leonard et al. |
| 2012/0018735 A1 | 1/2012 | Ishii |
| 2012/0086497 A1 | 4/2012 | Vorhaus |
| 2012/0126240 A1 | 5/2012 | Won |
| 2012/0199875 A1 | 8/2012 | Bhalla et al. |
| 2012/0211802 A1 | 8/2012 | Tamari |
| 2012/0218783 A1 | 8/2012 | Imada |
| 2012/0262220 A1 | 10/2012 | Springett |
| 2013/0032897 A1* | 2/2013 | Narayanan ........ H01L 21/26513 257/410 |
| 2013/0277687 A1 | 10/2013 | Kobayashi et al. |
| 2013/0280877 A1 | 10/2013 | Kobayashi et al. |
| 2014/0117559 A1 | 5/2014 | Zimmerman et al. |
| 2014/0264266 A1 | 9/2014 | Li et al. |
| 2014/0264454 A1* | 9/2014 | Banerjee ............. H01L 29/7786 257/194 |

FOREIGN PATENT DOCUMENTS

| | | |
|---|---|---|
| JP | H10242584 A | 9/1998 |
| JP | 2000031535 A | 1/2000 |
| JP | 2003332618 A | 11/2003 |
| JP | 2008148511 A | 6/2008 |
| JP | 2008258419 A | 10/2008 |
| KR | 20070066051 A | 6/2007 |
| WO | 2004051707 A3 | 6/2004 |
| WO | 2011162243 A1 | 12/2011 |

OTHER PUBLICATIONS

Lin, H. C. et al., "Leakage current and breakdown electric-field studies on ultrathin atomic-layer-deposited $Al_2O_3$ on GaAs," Applied Physics Letters, vol. 87, 2005, pp. 182094-1 to 182094-3.

Lossy, R. et al., "Gallium nitride MIS-HEMT using atomic layer deposited Al2O3 as gate dielectric," Journal of Vacuum Science & Technology A: Vacuum, Surfaces, and Films, vol. 31, No. 1, Jan./Feb. 2013, 6 pages.

Seok, O. et al., "High-breakdown voltage and low on-resistance AlGaN/GaN on Si MOS-HEMTs employing an extended Tan gate on HfO2 gate insulator," Electronics Letters, vol. 49, No. 6, Institute of Engineering and Technology, Mar. 14, 2013, 2 pages.

Tang, K. et al., "Enhancement-mode Gan Hybrid MOS-HEMTs with Breakdown Voltage of 1300V," 21st International Symposium on Power Semiconductor Devices & IC's, ISPSD 2009, IEEE, Jun. 14-18, 2009, Barcelona, Spain, pp. 279-282.

Ye, P.D., et al., "GaN MOS-HEMT Using Atomic Layer Deposition Al2O3 as Gate Dielectric and Surface Passivation," International Journal of High Speed Electronics and Systems, vol. 14, No. 3, 2004, pp. 791-796.

Notice of Allowance for U.S. Appl. No. 13/914,060, mailed Nov. 13, 2014, 8 pages.

Non-Final Office Action for U.S. Appl. No. 13/966,400, mailed Sep. 3, 2014, 9 pages.

Final Office Action for U.S. Appl. No. 13/966,400, mailed Dec. 3, 2014, 8 pages.

Non-Final Office Action for U.S. Appl. No. 13/957,698, mailed Nov. 5, 2014, 11 pages.

International Search Report and Written Opinion for PCT/US2013/056132, mailed Oct. 10, 2013, 11 pages.

Final Office Action for U.S. Appl. No. 13/973,482, mailed Nov. 5, 2014, 9 pages.

International Search Report and Written Opinion for PCT/US2013/056187, mailed Oct. 10, 2013, 11 pages.

Non-Final Office Action for U.S. Appl. No. 13/973,482, mailed May 23, 2014, 8 pages.

Non-Final Office Action for U.S. Appl. No. 13/795,986, mailed Apr. 24, 2014, 13 pages.

Final Office Action for U.S. Appl. No. 13/795,986, mailed Dec. 5, 2014, 16 pages.

International Search Report for GB0902558.6, issued Jun. 15, 2010, by the UK Intellectual Property Office, 2 pages.

(56) References Cited

OTHER PUBLICATIONS

Examination Report for British Patent Application No. 0902558.6, mailed Nov. 16, 2012, 5 pages.
Examination Report for British Patent Application No. GB0902558. 6, issued Feb. 28, 2013, 2 pages.
Non-Final Office Action for U.S. Appl. No. 12/705,869, mailed Feb. 9, 2012, 10 pages.
Notice of Allowance for U.S. Appl. No. 12/705,869, mailed Apr. 4, 2013, 9 pages.
Notice of Allowance for U.S. Appl. No. 12/705,869, mailed Jul. 19, 2012, 8 pages.
Advisory Action for U.S. Appl. No. 12/841,225, mailed Apr. 16, 2012, 3 pages.
Final Office Action for U.S. Appl. No. 12/841,225 mailed Feb. 1, 2012, 9 pages.
Non-Final Office Action for U.S. Appl. No. 12/841,225, mailed May 2, 2012, 10 pages.
Non-Final Office Action for U.S. Appl. No. 12/841,225 mailed Dec. 22, 2011, 8 pages.
Non-Final Office Action for U.S. Appl. No. 12/841,257 mailed Jan. 5, 2012, 13 pages.
Notice of Allowance for U.S. Appl. No. 13/795,926, mailed Apr. 27, 2015, 8 pages.
Notice of Allowance for U.S. Appl. No. 13/942,998, mailed Apr. 27, 2015, 8 pages.
Final Office Action for U.S. Appl. No. 13/871,526, mailed Jun. 17, 2015, 11 pages.
Advisory Action for U.S. Appl. No. 13/871,526, mailed Sep. 3, 2015, 3 pages.
International Preliminary Report on Patentability for PCT/US2013/056105, mailed Mar. 5, 2015, 12 pages.
Advisory Action for U.S. Appl. No. 13/910,202, mailed Apr. 6, 2015, 3 pages.
Notice of Allowance for U.S. Appl. No. 13/910,202, mailed May 14, 2015, 9 pages.
International Preliminary Report on Patentability for PCT/US2013/056126, mailed Mar. 5, 2015, 7 pages.
Final Office Action for U.S. Appl. No. 13/974,488, mailed Feb. 20, 2015, 8 pages.
Notice of Allowance for U.S. Appl. No. 13/974,488, mailed May 29, 2015, 9 pages.
Notice of Allowance for U.S. Appl. No. 13/966,400, mailed Feb. 20, 2015, 8 pages.
Notice of Allowance for U.S. Appl. No. 13/957,698, mailed Mar. 30, 2015, 7 pages.
Corrected/Supplemental Notice of Allowability for U.S. Appl. No. 13/957,689, mailed May 20, 2015, 3 pages.
Corrected/Supplement Notice of Allowability for U.S. Appl. No. 13/957,689, mailed Jun. 9, 2015, 4 pages.
Notice of Allowance for U.S. Appl. No. 13/957,698, mailed Jul. 20, 2015, 7 pages.
Non-Final Office Action for U.S. Appl. No. 14/557,940, mailed Aug. 31, 2015, 8 pages.
International Preliminary Report on Patentability for PCT/US2013/056132, mailed Mar. 5, 2015, 9 pages.
International Preliminary Report on Patentability for PCT/US2013/056187, mailed Mar. 12, 2015, 9 pages.
Notice of Allowance for U.S. Appl. No. 13/973,482, mailed May 4, 2015, 7 pages.
Notice of Allowance for U.S. Appl. No. 13/795,986, mailed Mar. 6, 2015, 8 pages.
Non-Final Office Action for U.S. Appl. No. 14/067,019, mailed Mar. 25, 2015, 7 pages.
Advisory Action for U.S. Appl. No. 10/620,205, mailed Feb. 15, 2005, 2 pages.
Notice of Allowance for U.S. Appl. No. 10/620,205, mailed Dec. 8, 2005, 4 pages.
Notice of Allowance for U.S. Appl. No. 12/841,225, mailed Nov. 9, 2012, 5 pages.
Non-Final Office Action for U.S. Appl. No. 14/749,274, mailed Feb. 22, 2016, 6 pages.
Corrected/Supplemental Notice of Allowability for U.S. Appl. No. 13/957,698, mailed Nov. 4, 2015, 4 pages.
Final Office Action for U.S. Appl. No. 14/557,940, mailed Feb. 8, 2016, 8 pages.
Notice of Allowance for U.S. Appl. No. 14/067,019, mailed Oct. 13, 2015, 6 pages.
Author Unknown, "CGHV1J006D: 6 W, 18.0 GHz, GaN HEMT Die," Cree, Inc., 2014, 9 pages.
Boutros, K.S., et al., "5W GaN MMIC for Millimeter-Wave Applications," 2006 Compound Semiconductor Integrated Circuit Symposium, Nov. 2006, pp. 93-95.
Chang, S.J. et al., "Improved ESD protection by combining InGaN-GaN MQW LEDs with GaN Scholtky diodes," IEEE Electron Device Letters, Mar. 2003, vol. 24, No. 3, pp. 129-131.
Chao, C-H., et al., "Theoretical demonstration of enhancement of light extraction of flip-chip GaN light-emitting diodes with photonic crystals," Applied Physics Letters, vol. 89, 2006, 4 pages.
Cho, H., et al., "High Density Plasma Via Hole Etching in SiC," Journal of Vaccuum Science & Technology A: Surfaces and Films, vol. 19, No. 4, Jul./Aug. 2001, pp. 1878-1881.
Darwish, A.M., et al., "Dependence of GaN HEMT Millimeter-Wave Performance on Temperature," IEEE Transactions on Microwave Thoery and Techniques, vol. 57, No. 12, Dec. 2009, pp. 3205-3211.
Fath, P. et al., "Mechanical water engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.
Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.
Hibbard, D.L. et al., "Low Resistance High Reflectance Contacts to p-GaN Using Oxidized Ni/Au and Al or Ag," Applied Physics Letters, vol. 83, No. 2, Jul. 14, 2003, pp. 311-313.
Krüger, Olaf, et al., "Laser-Assisted Processing of VIAs for AlGaN/GaN HEMTs on SiC Substrates," IEEE Electron Device Letters, vol. 27, No. 6, Jun. 2006, pp. 425-427.
Lee, S.J., "Study of photon extraction efficiency in InGaN light-emitting diodes depending on chip structures and chip-mount schemes," Optical Engineering, SPIE, Jan. 2006, vol. 45, No. 1, 14 pages.
Shchekin, O.B. et al., "High performance thin-film flip-chip InGaN—GaN light-emitting diodes," Applied Physics Letters, vol. 89, 071109, Aug. 2006, 4 pages.
Sheppard, S.T., et al., "High Power Demonstration at 10 GHz with GaN/AlGaN HEMT Hybrid Amplifiers," 2000 Device Research Conference, Conference Digest, Jun. 2000, pp. 37-38.
Wierer, J.J., et al., "High-power AlGaInN flip-chip light-emitting diodes," Applied Physics Letters, vol. 78, No. 22, May 28, 2001, pp. 3379-3381.
Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.
Windisch, R. et al., "Impact of texture-enhanced transmission on High-efficiency surface-textured light-emitting diodes," Applied Physics Letters, Oct. 8, 2001, vol. 79, No. 15, pp. 2315-2317.
Final Office Action for U.S. Appl. No. 10/620,205, mailed Dec. 16, 2004, 9 pages.
Non-Final Office Action for U.S. Appl. No. 10/620,205, mailed Jul. 23, 2004, 7 pages.
Non-Final Office Action for U.S. Appl. No. 10/620,205, mailed May 3, 2005, 10 pages.
Non-Final Office Action for U.S. Appl. No. 10/689,980, mailed Jan. 26, 2005, 7 pages.
Non-Final Office Action for U.S. Appl. No. 10/689,980, mailed May 12, 2005, 8 pages.
Non-Final Office Action for U.S. Appl. No. 11/397,279, mailed Oct. 31, 2007, 7 pages.

(56) References Cited

OTHER PUBLICATIONS

Notice of Allowance for U.S. Appl. No. 11/397,279, mailed Apr. 17, 2008, 7 pages.
Final Office Action for U.S. Appl. No. 10/689,979, mailed Jun. 29, 2005, 16 pages.
Non-Final Office Action for U.S. Appl. No. 10/689,979, mailed Jan. 11, 2005, 14 pages.
Notice of Allowance for U.S. Appl. No. 10/689,979, mailed Oct. 26, 2005, 6 pages.
Non-Final Office Action for U.S. Appl. No. 11/360,734, mailed Jan. 18, 2006, 10 pages.
Notice of Allowance for U.S. Appl. No. 11/360,734, mailed Aug. 7, 2008, 6 pages.
Final Office Action for U.S. Appl. No. 11/937,207, mailed Nov. 19, 2009, 9 pages.
Non-Final Office Action for U.S. Appl. No. 11/937,207, mailed Mar. 18, 2010, 10 pages.
Non-Final Office Action for U.S. Appl. No. 11/937,207, mailed May 29, 2009, 11 pages.
Notice of Allowance for U.S. Appl. No. 11/937,207, mailed Feb. 28, 2011, 8 pages.
Quayle Action for U.S. Appl. No. 11/937,207, mailed Nov. 24, 2010, 4 pages.
Final Office Action for U.S. Appl. No. 11/458,833, mailed Dec. 15, 2008, 13 pages.
Non-Final Office Action for U.S. Appl. No. 11/458,833, mailed Apr. 1, 2008, 10 pages.
Notice of Allowance for U.S. Appl. No. 11/458,833, mailed Mar. 9, 2009, 7 pages.
Non-Final Office Action for U.S. Appl. No. 13/795,926, mailed Dec. 19, 2014, 14 pages.
Non-Final Office Action for U.S. Appl. No. 13/942,998, mailed Nov. 19, 2014, 9 pages.
Non-Final Office Action for U.S. Appl. No. 13/871,526, mailed Dec. 16, 2014, 17 pages.
Invitation to Pay Fees for PCT/US2013/056105, mailed Nov. 5, 2013, 7 pages.
International Search Report and Written Opinion for PCT/US2013/056105, mailed Feb. 12, 2014, 15 pages.
Non-Final Office Action for U.S. Appl. No. 13/910,202, mailed Sep. 25, 2014, 9 pages.
Final Office Action for U.S. Appl. No. 13/910,202, mailed Jan. 20, 2015, 10 pages.
International Search Report and Written Opinion for PCT/US2013/056126, mailed Oct. 25, 2013, 10 pages.
Non-Final Office Action for U.S. Appl. No. 13/927,182, mailed May 1, 2014, 7 pages.
Final Office Action for U.S. Appl. No. 13/927,182, mailed Sep. 17, 2014, 10 pages.
Non-Final Office Action for U.S. Appl. No. 13/974,488, mailed Oct. 28, 2014, 8 pages.
Huang, Xiucheng et al., "Analytical Loss Model of High Voltage GaN HEMT in Cascode Configuration," IEEE Transactions on Power Electronics, vol. 29, No. 5, May 2014, IEEE, pp. 2208-2219.
Lee, Han S., "GaN-on-Silicon-Based Power Switch in Sintered, Dual-Side Cooled Package," PowerElectronics.com, Jan. 2, 2013, 5 pages, http://powerelectronics.com/discrete-power-semis/gan-silicon-based-power-switch-sintered-dual-side-cooled-package.
Liang, Zhenxian et al., "Embedded Power—An Integration Packaging Technology for IPEMs," The International Journal of Microcircuits and Electronic Packaging, vol. 23, No. 4, 2000, pp. 461-487.
Li, Xueqing et al., "Investigation of SiC Stack and Discrete Cascodes" PowerPoint Presentation, PCIM Europe, May 20-22, 2014, Nuremberg, Germany, 26 slides.
Stevanovic, Ljubisa D. et al., "Low Inductance Power Module with Blade Connector," 2010 Twenty-Fifth Annual IEEE Applied Power Electronics Conference and Exposition (APEC), Feb. 21-25, 2010, IEEE, Palm Springs, CA, pp. 1603-1609.
Liang, Zhenxian et al., "Embedded Power—A Multilayer Integration Technology for Packaging of IPEMs and PEBBs," Proceedings of International Workshop on Integrated Power Packaging, Jul. 14-16, 2000, IEEE, pp. 41-45.
Non-Final Office Action for U.S. Appl. No. 13/871,526, mailed Mar. 8, 2016, 13 pages.
Final Office Action for U.S. Appl. No. 14/749,274, mailed Jun. 23, 2016, 6 pages.
Non-Final Office Action for U.S. Appl. No. 14/797,573, mailed Jul. 7, 2016, 8 pages.

* cited by examiner

SCHOTTKY GATED TRANSISTOR WITH INTERFACIAL LAYER

RELATED APPLICATIONS

This application claims the benefit of U.S. provisional patent application No. 62/008,900, filed Jun. 6, 2014, the disclosure of which is incorporated herein by reference in its entirety.

FIELD OF THE DISCLOSURE

The present disclosure pertains to reducing gate leakage current in high-power transistors.

BACKGROUND

Schottky gate gallium nitride (GaN) transistors used in power switching applications suffer from undesirably high gate leakage current, which results in lower operational efficiency due to excessive power dissipation. Reverse gate leakage for a Schottky contact on a GaN device is typically 10 µA to 1 mA per millimeter (mm) of gate width depending on the construction of the device. For a Schottky gated GaN power transistor with 100 mm gate periphery, the gate-to-drain leakage would be on the order of 1 mA to 100 mA. In contrast, silicon-based power transistors having a dielectric deposited under the gate to provide an "insulated gate" have a much lower leakage current that ranges from about 1 nA to around 100 nA. Moreover, silicon has a natural advantage of an extremely high-quality native oxide, which is silicon dioxide ($SiO_2$). As such, silicon metal oxide field effect transistors (Si MOSFETs) and insulated gate bipolar transistors (IGBTs) are relatively easily fabricated. Consequently, Si MOSFET devices and IGBT devices dominate the power transistor market. For many years, alternative semiconductors fabricated using wide bandgap semiconductors such as silicon carbide (SiC) and GaN have been evaluated in an attempt to achieve better performance than silicon devices. In most cases, a primary obstacle has been a lack of a high-quality insulator material.

Gallium nitride (GaN) metal oxide semiconductor—high electron mobility transistors (MOSHEMTs) using dielectrics such as $SiO_2$, silicon nitride (SiN), hafnium dioxide ($HfO_2$), aluminum oxide ($Al_2O_3$), and aluminum nitride (AlN) have been proposed, but the performance and reliability of these dielectrics have been limited by the poor interface properties of dielectrics on GaN. One problem is a large hysteresis in current-voltage ($I_D$-$V_G$) transfer characteristics after an application of drain voltage. Another problem is time-dependent gate oxide breakdown (TDDB) caused by relatively large reverse bias voltages applied during operation. Still other problems include threshold voltage instability and mobility degradation due to columbic scattering.

Compounding these problems is a need for an undesirably thick dielectric to support high electric fields that occur in high-voltage GaN transistors that operate under drain voltages that range between 600V and 1200V. For example, a typical high-voltage GaN MOSHEMT typically has an insulating gate layer with a thickness that ranges between 100 Angstroms (Å) and 500 Å. Further still, for a given density of trapped interface charge (Qit) a thick dielectric with a relatively low areal capacitance (Cox) results in a significant threshold voltage (Vth) shift (Δ) that is governed by the following mathematical relationship.

$$\Delta Vth = Qit/Cox \quad \text{EQ. 1}$$

As illustrated by EQ. 1, a larger ΔVth occurs for a given Qit as Cox decreases as the insulating gate layer gets thicker. As a result, performance of a GaN MOSHEMT is degraded with increased gate layer thickness. At some point, the Vth is shifted too much to be practical. Thus, there exists a need for a low-leakage gate for GaN transistors that does not suffer from the disadvantages of insulated gate structures.

SUMMARY

A Schottky gated transistor having reduced gate leakage current is disclosed. The Schottky gated transistor includes a substrate and a plurality of epitaxial layers disposed on the substrate. Further included is a gate contact having an interfacial layer disposed on a surface of the plurality of epitaxial layers and having a thickness that is between about 5 Angstroms (Å) and 40 Å. In at least some embodiments, the interfacial layer is made up of non-native materials in contrast to a native insulator such as silicon dioxide ($SiO_2$) that is used as an insulating gate layer with silicon-based power transistors.

The Schottky gated transistor further includes at least one metal layer disposed over the interfacial layer. A source contact and a drain contact are disposed on the surface of the plurality of epitaxial layers, wherein the source contact and the drain contact are spaced apart from the gate contact and each other. A benefit of embodiments of the present disclosure is that the interfacial layer provides forward conduction characteristics that are substantially the same as traditional Schottky gated transistors while gate leakage current under reverse gate voltage conditions is reduced by several orders of magnitude in comparison to traditional Schottky transistors.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description, serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

This disclosure provides a Schottky gated transistor with an interfacial layer comprising a gate contact that substantially reduces gate leakage current in comparison to traditional Schottky gated transistors. Moreover, the disclosed interfacial layer is ultra-thin having an atomic scale thickness that allows carrier tunneling, which prevents persistent charge trapping.

Figure 1:
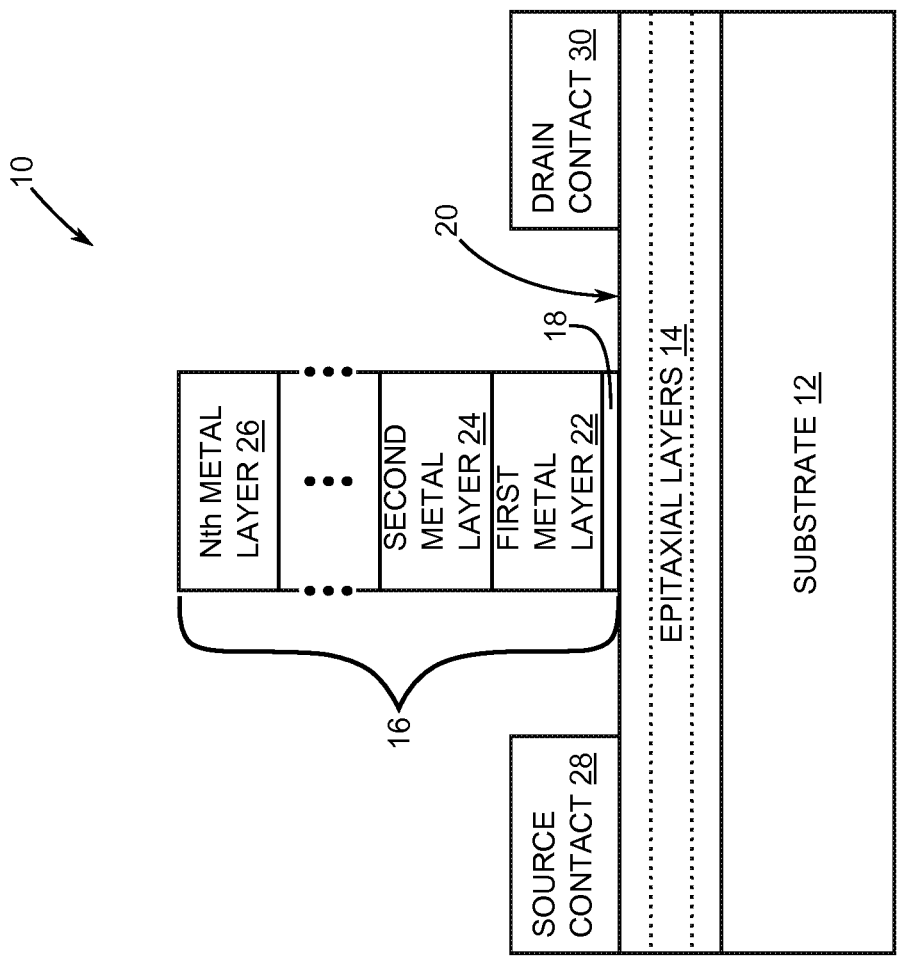
FIG. 1 is a cross-sectional diagram depicting the structure of a Schottky gated transistor with an interfacial layer in accordance with the present disclosure.

FIG. 1 is a cross-sectional diagram depicting the structure of a Schottky gated transistor 10 that is structured in accordance with the present disclosure. The Schottky gated transistor 10 includes a substrate 12 over which epitaxial layers 14 are disposed. At least one of the epitaxial layers is a gallium nitride (GaN) based layer. In at least one embodiment, the Schottky gated transistor 10 is a power transistor that is adapted for power switching applications. In one embodiment, the Schottky gated transistor 10 has a drain-to-source breakdown voltage that ranges from greater than 200V to around 600V. In another embodiment, the Schottky gated transistor 10 has a drain-to-source breakdown voltage that ranges from greater than 600V to around 1200V.

A gate contact 16 includes an interfacial layer 18 that is disposed on a surface 20 of the epitaxial layers 14. The interfacial layer 18 is made up of a substantially thin layer of relatively high-resistivity material. In some embodiments, the interfacial layer 18 is deposited using atomic layer deposition of aluminum oxide ($Al_2O_3$), aluminum nitride (AlN), or aluminum oxynitrides ($AlO_xN_y$). In some embodiments, the interfacial layer 18 is deposited using atomic layer deposition or pulsed chemical vapor deposition of silicon oxide ($SiO_2$), silicon nitrides ($SiN_x$), or silicon oxynitrides ($SiO_xN_y$). More extensive lists of exemplary compounds that are usable as the interfacial layer 18 are given further below.

Independent of the material used to make up the interfacial layer 18, the thickness of the interfacial layer is less than 40 Angstroms (Å) but greater than about 5 Å. In at least some embodiments, the thickness of the interfacial layer 18 is between about 5 Å and 15 Å. In other embodiments, the thickness of the interfacial layer 18 is between 15 Å and 25 Å. Yet in other embodiments, the thickness of the interfacial layer 18 is between 25 Å and 40 Å.

The gate contact 16 further includes Schottky metal layers, which in this exemplary embodiment include a first metal layer 22 disposed on the interfacial layer 18, a second metal layer 24 disposed on the first metal layer 22, and an Nth layer 26 disposed over the second metal layer 22. The Schottky metal layers are made up of metals that include, but are not limited to, nickel (Ni), platinum (Pt), palladium (Pd), platinum silicide (PtSi), gold (Au), titanium (Ti), iridium (Ir), and iridium oxide ($IrO_2$).

The Schottky gated transistor 10 also includes a source contact 28 and a drain contact 30, which are both disposed on the surface 20. The gate contact 16, source contact 28, and the drain contact 30 are spaced apart along the surface 20.

A typical GaN-type Schottky gated transistor without the interfacial layer 18 will have a leakage current under reverse gate voltage conditions that ranges from around 10 µA to around 1 mA per mm of gate periphery. The interfacial layer 18 is adapted to substantially reduce leakage current in the GaN-type Schottky gated transistor 10 under reverse gate voltage conditions. The interfacial layer 18 substantially reduces leakage current while maintaining practically the same forward conduction current-voltage (I-V) characteristics of the typical GaN-type Schottky gated transistor that does not include the interfacial layer 18. The reduction of leakage current under reverse gate voltage conditions is on the order of 1 to 3 orders of magnitude. Exemplary embodiments of interfacial layer 18 reduce leakage current to within a range of on the order of 1 nA to about 100 nA per mm of gate periphery under reverse gate voltage conditions that range between −1 V to around −20V.

Another benefit provided by the interfacial layer 18 is that a brief period of forward conduction through a gate diode formed between the gate contact and the surface 20 when the Schottky gated transistor 10 is switched on prevents persistent charge trapping and hysteresis. In addition, the relative thinness of the interfacial layer 18 makes it difficult for charges to become trapped. Thus, switching performance of the Schottky gated transistor 10 is enhanced by incorporation of the interfacial layer 18.

A first exemplary list of compounds for making up the interfacial layer 18 includes, but is not limited to, aluminum oxide ($Al_2O_3$), bismuth trioxide ($Bi_2O_3$), calcium hafnium oxide (CaHfO), calcium oxide (CaO), cerium(III) oxide ($Ce_2O_3$), and copper oxides ($CuO_x$). A second exemplary list of compounds for making up the interfacial layer 18 includes, but is not limited to, dysprosium(III) oxide ($Dy_2O_3$), erbium oxide ($ErO_3$), europium(III) oxide ($Eu_2O_3$), iron(III) oxide ($Fe_2O_3$), gallium(III) oxide ($Ga_2O_3$), and gadolinium(III) oxide ($Gd_2O_3$). A third exemplary list of compounds for making up the interfacial layer 18 includes, but is not limited to, hafnium oxide ($HfO_2$) holmium(III) oxide ($Ho_2O_3$), indium(III) oxide ($In_2O_3$), lanthanum oxide ($La_2O_3$), lutetium(III) oxide ($Lu_2O_3$), and magnesium oxide (MgO).

A fourth exemplary list of compounds for making up the interfacial layer 18 includes, but is not limited to, nickel monoxide (NiO), niobium pentoxide ($Nb_2O_5$), lead monoxide (PbO), praseodymium(III) oxide ($Pr_2O_3$), platinum oxides ($PtO_x$), rhodium(III) oxide ($Rh_2O_3$), and ruthenium oxide ($RuO_x$). A fifth exemplary list of compounds for making up the interfacial layer 18 includes, but is not limited to, scandium(III) oxide ($Sc_2O_3$), silicon dioxide ($SiO_2$), samarium(III) oxide ($Sm_2O_3$), tin dioxide ($SnO_2$), strontium oxide (SrO), and tantalum(V) oxide ($Ta_2O_5$). A sixth exemplary list of compounds for making up the interfacial layer 18 includes, but is not limited to, titanium dioxide ($TiO_2$), thulium(III) oxide ($Tm_2O_3$), vanadium oxides ($V_2O_x$), tungsten oxide ($WO_x$), yttrium oxide ($Y_2O_3$), zinc oxide (ZnO), and zirconium dioxide ($ZrO_2$).

A seventh exemplary list of compounds for making up the interfacial layer 18 includes, but is not limited to, aluminum nitride (AlN), cobalt nitride (CoN), nitrified copper ($CuN_x$), hafnium nitride ($Hf_3N_4$), molybdenum nitride (MoN), nickel nitrides ($NiN_x$), silicon nitrides ($SiN_x$), tantalum nitride (TaN), titanium nitride (TiN), and zirconium nitride ($Zr_3N_4$). An eighth exemplary list of compounds for making up the interfacial layer 18 includes, but is not limited to, lanthanum fluoride ($LaF_3$) and zinc fluoride (ZnF). A ninth exemplary list of compounds for making up the interfacial layer 18 includes, but is not limited to, lead sulfide (PbS), cadmium sulfide (CdS), cupric sulfide (CuS), manganese sulfide (MnS), tin(II) sulfide (SnS), and zinc sulfide (ZnS). An tenth exemplary list of compounds for making up the interfacial layer includes, but is not limited to, oxynitrides of the compounds in the first exemplary list through the ninth exemplary list above.

Figure 2:
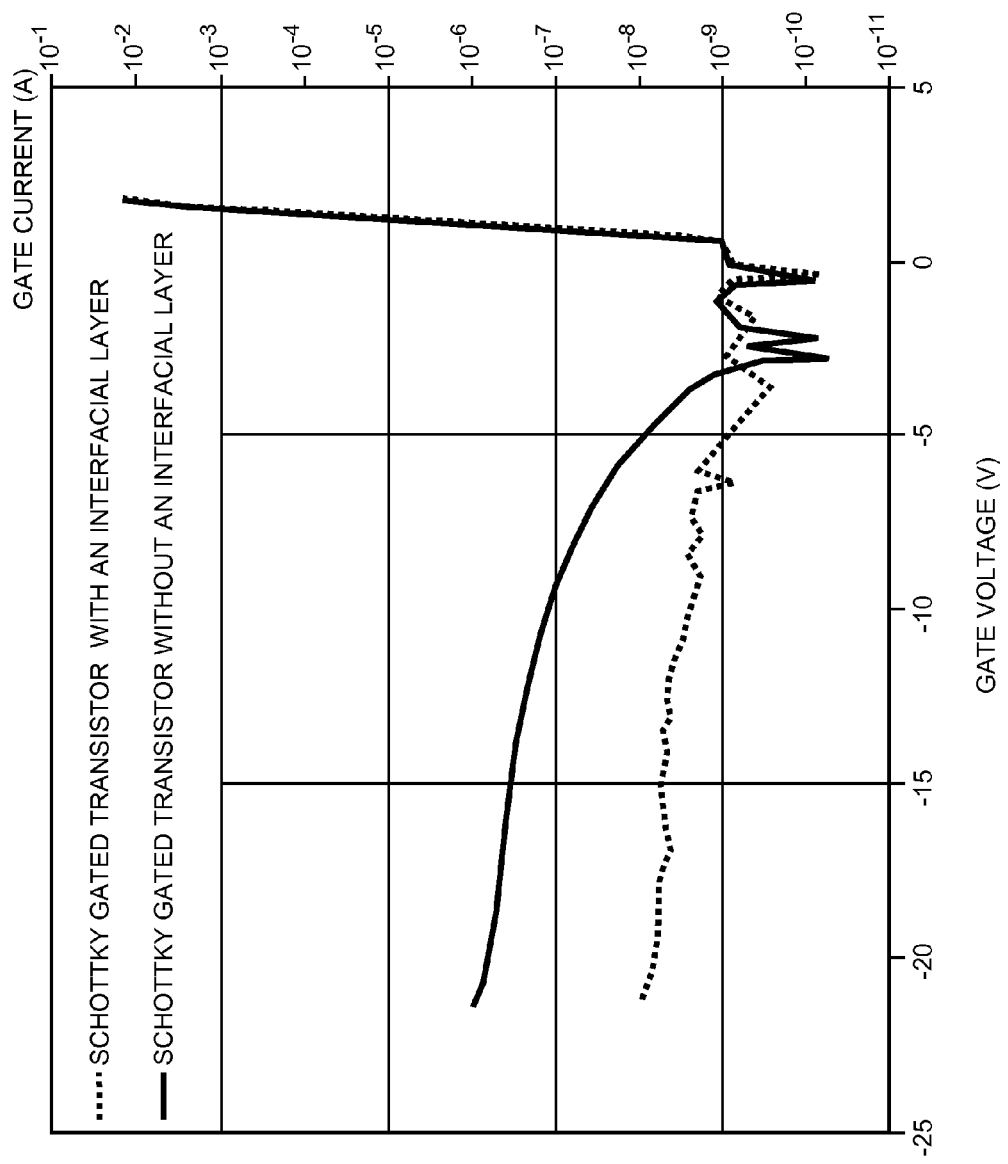
FIG. 2 is a graph of current-voltage (I-V) curves comparing the gate current of Schottky gated transistor with the interfacial layer to a Schottky gated transistor without an interfacial layer.

FIG. 2 is a graph of current-voltage (I-V) curves comparing gate current of the Schottky gated transistor 10 (FIG. 1) with the interfacial layer 18 (FIG. 1) with gate current for a Schottky gated transistor (not shown) without an interfacial layer. Notice that with positive gate voltage applied, gate current for the Schottky gated transistor 10 with the interfacial layer 18 as presently disclosed has practically the same I-V curve forward conduction as a traditional Schottky gated transistor without the interfacial layer 18. In contrast, with a reverse gate voltage applied the Schottky gated transistor 10 with the interfacial layer 18 shows a 1 to 3 order of magnitude reduction in gate leakage current in comparison to the traditional Schottky gated transistor without the interfacial layer 18.

Figure 3:
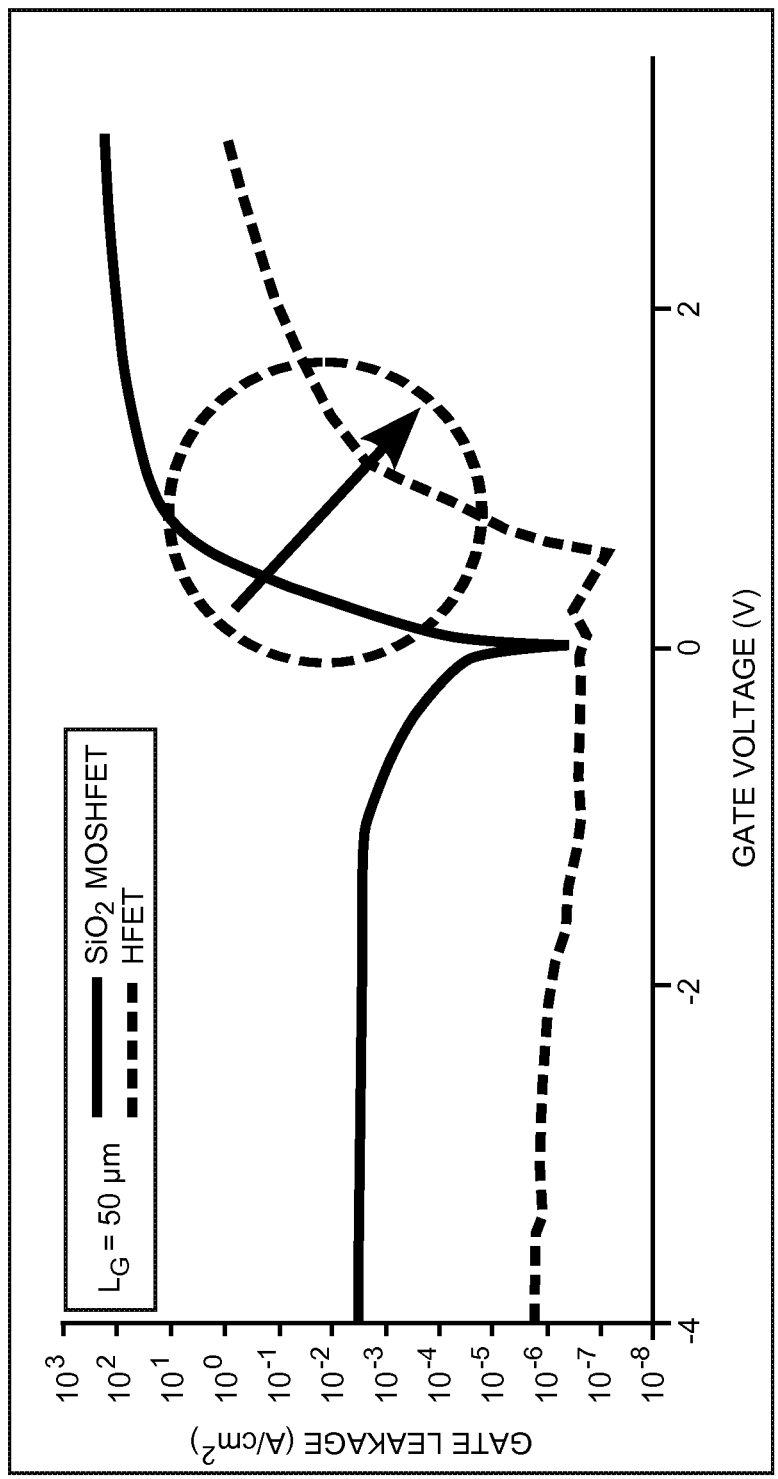
FIG. 3 is a graph of gate I-V curves for a related art silicon dioxide ($SiO_2$) metal oxide semiconductor heterostructure field effect transistor (MOSHFET) having a relatively thick gate insulator compared to a Schottky gate HFET (HFET is another term for HEMT).

FIG. 3 is a graph of I-V curves for a related art $SiO_2$ metal oxide semiconductor heterostructure field effect transistor (MOSHFET) having a relatively thick gate insulator compared with a Schottky gate heterostructure field effect transistor (HFET). Note that for the purpose of this disclosure, HFET is another term for high electron mobility transistor (HEMT). Both the related art MOSHFET and the related art HFET each have a gate length $L_G$=50 µM. As illustrated by the region in the dashed circle, the related art MOSHFET shows a substantially altered I-V curve forward conduction characteristic compared with the I-V curve forward conduction characteristic for the Schottky gate HFET. This is a result of either using a specific material for an insulating layer having a poor interface with the surface 20 and or increased material thickness for the insulating layer needed to achieve a satisfactory low gate leakage current. As the material thickness for the insulating layer increases, the forward conductance gets lower, as indicated by the downwardly sloping arrow within the dashed circle, indicating an increasingly MOSHFET-like transistor. A take away from FIG. 3 is that the interface layer 18 (FIG. 1) provides superior reduced gate leakage compared with the Schottky gate HFET of FIG. 3 under reverse gate voltage conditions, while maintaining an unaltered I-V forward conduction characteristic and avoiding the disadvantages of the MOSHFET-like devices (charge trapping and TDDB in the thicker insulating layer that is serving as the gate dielectric). In particular, the Schottky gated transistor forward conduction characteristics of a gate diode formed under the gate contact are substantially unchanged in comparison with forward conduction characteristics of a gate diode formed under a gate contact that does not include the interfacial layer.

Those skilled in the art will recognize improvements and modifications to the embodiments of the present disclosure. All such improvements and modifications are considered within the scope of the concepts disclosed herein and the claims that follow.

What is claimed is:

1. A Schottky gated transistor comprising:
   a substrate;
   a plurality of epitaxial layers disposed on the substrate, wherein at least one of the epitaxial layers is gallium nitride (GaN) based;
   a gate contact comprising:
     an interfacial layer disposed on a surface of the plurality of epitaxial layers and having a thickness that is between about 5 Angstroms (Å) and 40 Å, wherein the interfacial layer is formed from a material that limits gate leakage current to a range of 1 nA to 100 nA per mm of gate periphery under reverse gate voltage conditions that range from −1V to −20V; and
     at least one metal layer disposed over the interfacial layer;
   a source contact disposed on the surface of the plurality of epitaxial layers; and
   a drain contact disposed on the surface of the plurality of epitaxial layers, wherein the source contact and the drain contact are spaced apart from the gate contact and each other.

2. The Schottky gated transistor of claim 1 wherein a drain-to-source breakdown voltage ranges between about 200V and 600V.

3. The Schottky gated transistor of claim 1 wherein a drain-to-source breakdown voltage ranges between about 600V and 1200V.

4. The Schottky gated transistor of claim 1 wherein the thickness of the interfacial layer is between about 5 Å and 15 Å.

5. The Schottky gated transistor of claim 1 wherein the thickness of the interfacial layer is between about 15 Å and 25 Å.

6. The Schottky gated transistor of claim 1 wherein the thickness of the interfacial layer is between about 25 Å and about 40 Å.

7. The Schottky gated transistor of claim 1 wherein the material making up the interfacial layer is selected from the group consisting of bismuth trioxide ($Bi_2O_3$), calcium hafnium oxide (CaHfO), calcium oxide (CaO), cerium(III) oxide ($Ce_2O_3$), and copper oxides (CuOx).

8. The Schottky gated transistor of claim 1 wherein the material making up the interfacial layer is selected from the group consisting of dysprosium(III) oxide ($Dy_2O_3$), erbium oxide ($ErO_3$), europium(III) oxide ($Eu_2O_3$), iron(III) oxide ($Fe_2O_3$), gallium(III) oxide ($Ga_2O_3$), and gadolinium(III) oxide ($Gd_2O_3$).

9. The Schottky gated transistor of claim 1 wherein the material making up the interfacial layer is selected from the group consisting of holmium(III) oxide ($Ho_2O_3$), indium (III) oxide ($In_2O_3$), lanthanum oxide ($La_2O_3$), lutetium(III) oxide ($Lu_2O_3$), and magnesium oxide (MgO).

10. The Schottky gated transistor of claim 1 wherein the material making up the interfacial layer is selected from the group consisting of nickel monoxide (NiO), niobium pentoxide ($Nb_2O_5$), lead monoxide (PbO), praseodymium(III) oxide ($Pr_2O_3$), platinum oxides ($PtO_x$), rhodium(III) oxide ($Rh_2O_3$), and ruthenium oxide ($RuO_x$).

11. The Schottky gated transistor of claim 1 wherein the material making up the interfacial layer is selected from the group consisting of scandium(III) oxide ($Sc_2O_3$), samarium (III) oxide ($Sm_2O_3$), tin dioxide ($SnO_2$), strontium oxide (SrO), and tantalum(V) oxide ($Ta_2O_5$).

12. The Schottky gated transistor of claim 1 wherein the material making up the interfacial layer is selected from the group consisting of titanium dioxide ($TiO_2$), thulium(III) oxide ($Tm_2O_3$), vanadium oxides ($V_2O_x$), tungsten oxide ($WO_x$), yttrium oxide ($Y_2O_3$), zinc oxide (ZnO), and zirconium dioxide ($ZrO_2$).

13. The Schottky gated transistor of claim 1 wherein the material making up the interfacial layer is selected from the group consisting of cobalt nitride (CoN), nitrified copper ($CuN_x$), hafnium nitride ($Hf_3N_4$), molybdenum nitride (MoN), nickel nitrides ($NiN_x$), silicon nitrides ($SiN_x$), tantalum nitride (TaN), titanium nitride (TiN), and zirconium nitride ($Zr_3N_4$).

14. The Schottky gated transistor of claim 1 wherein the material making up the interfacial layer is selected from the group consisting of lanthanum fluoride ($LaF_3$) and zinc fluoride (ZnF).

15. The Schottky gated transistor of claim 1 wherein the material making up the interfacial layer is selected from the group consisting of lead sulfide (PbS), cadmium sulfide (CdS), cupric sulfide (CuS), manganese sulfide (MnS), tin(II) sulfide (SnS), and zinc sulfide (ZnS).

16. The Schottky gated transistor of claim 1 wherein the material making up the interfacial layer is selected from the group consisting of aluminum oxide ($Al_2O_3$), aluminum nitride (AlN), silicon dioxide ($SiO_2$), and hafnium oxide ($HfO_2$).

17. The Schottky gated transistor of claim 1 wherein the at least one metal layer is selected from the group consisting of nickel (Ni), platinum (Pt), palladium (Pd), gold (Au), and titanium (Ti).

18. The Schottky gated transistor of claim 1 wherein the at least one metal layer is selected from the group consisting of iridium (Ir) and iridium oxide ($IrO_2$).

19. The Schottky gated transistor of claim 1 wherein forward conduction characteristics of a gate diode formed under the gate contact are substantially unchanged in comparison with forward conduction characteristics of a gate diode formed under a gate contact that does not include the interfacial layer.

* * * * *